United States Patent [19]
Ouchi et al.

[11] Patent Number: 6,097,067
[45] Date of Patent: *Aug. 1, 2000

[54] SEMICONDUCTOR DEVICE WITH ELECTRICALLY ISOLATED TRANSISTOR

[75] Inventors: Akihiro Ouchi, Isehara; Hayao Ohzu, Fuchu; Yukihiko Sakashita, Hadano, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/834,770

[22] Filed: Apr. 3, 1997

Related U.S. Application Data

[63] Continuation of application No. 08/591,344, Jan. 25, 1996, abandoned.

[30] Foreign Application Priority Data

Jan. 31, 1995 [JP] Japan ................................ 7-014095

[51] Int. Cl.[7] ........................... H01L 29/76; H01L 29/94; H01L 29/00
[52] U.S. Cl. ........................... 257/369; 257/371; 257/499
[58] Field of Search ................................ 257/369, 371, 257/372, 500, 499

[56] References Cited

U.S. PATENT DOCUMENTS

| | | | |
|---|---|---|---|
| 3,916,430 | 10/1975 | Heuner et al. ........................... | 357/42 |
| 4,670,672 | 6/1987 | Ando et al. ........................... | 307/443 |
| 4,791,321 | 12/1988 | Tanaka et al. ........................... | 307/451 |
| 5,025,230 | 6/1991 | Kondo et al. ........................... | 331/116 |
| 5,124,544 | 6/1992 | Ohzu ........................... | 250/211 |
| 5,386,135 | 1/1995 | Nakazato et al. ........................... | 257/369 |
| 5,389,811 | 2/1995 | Poucher et al. ........................... | 257/360 |
| 5,466,961 | 11/1995 | Kikuchi et al. ........................... | 257/379 |
| 5,581,103 | 12/1996 | Mizukami ........................... | 257/355 |

FOREIGN PATENT DOCUMENTS

| | | |
|---|---|---|
| 0398331A2 | 11/1990 | European Pat. Off. . |
| 3-006679 | 1/1991 | Japan . |
| 3-6679 | 1/1991 | Japan . |

*Primary Examiner*—Wael M. Fahmy
*Attorney, Agent, or Firm*—Fitzpatrick, Cella, Harper & Scinto

[57] ABSTRACT

In a semiconductor apparatus comprises a signal input portion having an amplifying circuit including one, two or more insulating gate type transistors (MIS Tr), one MIS Tr or at least one (M1) of the two or more MIS Trs of the signal input portion is an MIS Tr of one conductivity channel type. The MIS Tr (M1) of the one conductivity channel type is formed in a semiconductor region which is electrically isolated from the other MIS Tr (M3) of one conductivity channel type provided for a circuit portion other than the signal input portion, so that an input threshold level of the signal amplifying circuit is made coincide with a DC level of the input signal, thereby preventing an erroneous operation.

13 Claims, 7 Drawing Sheets

SEMICONDUCTOR DEVICE WITH ELECTRICALLY ISOLATED TRANSISTOR

This application is a continuation, of application Ser. No. 08/591,344, filed Jan. 25, 1996, now abandoned.

BACKGROUND OF THE INVENTION

1. Field of the Invention

The present invention relates to a semiconductor device and, more particularly, to a semiconductor device (semiconductor integrated circuit apparatus) in which a signal input portion has an amplifying circuit including one or two or more insulating gate type transistors such as MOS transistors and which can process, especially, a micro signal.

2. Related Background Art

As one of constructional examples of a simple amplifying circuit, an inverter circuit using an MOS transistor of a complementary type (hereinbelow, referred to as a CMOS) constructed as shown in a schematic circuit diagram of FIG. 1 is considered. That is, in FIG. 1, a source of a P-channel MOS transistor (hereinbelow, referred to as a PMOS Tr) M1 is connected to a $V_{DD}$ power source terminal 100, a drain of the PMOS Tr M1 is commonly connected to a drain of an N-channel MOS transistor (hereinbelow, referred to as an NMOS Tr) M2, a source of the NMOS Tr M2 is connected to a ground terminal 101, gates of the PMOS Tr M1 and NMOS Tr M2 are commonly connected to an input terminal 1, a back gate of the PMOS Tr M1 is connected to the $V_{DD}$ power source terminal 100, and a back gate of the NMOS Tr M2 is connected to the ground terminal 101, thereby constructing a CMOS inverter. An output of the CMOS inverter constructed by the PMOS Tr M1 and NMOS Tr M2 is connected to an input of an internal circuit (a CMOS inverter constructed by a PMOS Tr M3 and an NMOS Tr M4 in a manner similar to the CMOS inverter constructed by the PMOS Tr M1 and NMOS Tr M2 in FIG. 1). In this case, the PMOS Tr M1 of the input inverter and the PMOS Tr M3 of the internal circuit are formed on a same N well 12 as shown in FIG. 2 and the NMOS Tr M2 of the input inverter and the NMOS Tr M4 of the internal circuit are formed on a P-type substrate 15.

In FIG. 2, reference numeral 2001 denotes an n⁻ region formed in the P-type substrate 15. The PMOS Trs M1 and M3 are formed in this n⁻ region. Reference numerals 2002, 2003, 2004, and 2005 indicate p⁺ regions formed in the n⁻ region 2001, respectively. In FIG. 2, the p⁺ region 2003 becomes a source region of the PMOS Tr M1, the p⁺ region 2005 becomes a source region of the PMOS Tr M3, the p⁺ region 2002 becomes a drain region of the PMOS Tr M1, and the p⁺ region 2004 becomes a drain region of the PMOS Tr M3. Reference numerals 2007, 2008, 2009, and 2010 denote gate electrodes of the MOS Trs, respectively; 2006 and 2015 indicate back gates; and 2011, 2012, 2013, and 2014 show n⁺ regions. In FIG. 2, the n⁺ region 2011 becomes a source region of the NMOS Tr M2, the n⁺ region 2013 becomes a source region of the NMOS Tr M4, the n⁺ region 2012 becomes a drain region of the NMOS Tr M2, and the n⁺ region 2014 becomes a drain region of the NMOS Tr M4. The back gate 2006 is set to an n⁺ region in order to obtain a potential of the n⁻ region 2001. The back gate 2015 is set to a p⁺ region in order to obtain a potential of the P-type substrate 15.

In the foregoing CMOS inverter, however, when a signal of a micro amplitude is handled, it is important that a threshold level of the CMOS inverter and a DC level of an input signal coincide. In the case where the threshold level of the CMOS inverter is slightly deviated, there is a case where an erroneous operation of the circuit or the like occurs.

SUMMARY OF THE INVENTION

The invention is made in consideration of the above problems and it is an object of the invention to provide a semiconductor device which prevents an erroneous operation of a circuit or the like due to a difference between a threshold level of a signal amplifying circuit and a DC level of a micro input signal.

Another object of the invention is to provide a semiconductor device which can perform a correct operation even for a smaller micro signal.

Still another object of the invention is to provide a semiconductor device in which a signal input portion is constructed by an amplifying circuit including one or two or more insulating gate type transistors, wherein one insulating gate type transistor or at least one of the two or more insulating gate type transistors of the signal input portion is an insulating gate type transistor of a first conductivity channel type and the insulating gate type transistor of the first conductivity channel type is formed in a semiconductor region that is electrically isolated from the other insulating gate type transistor of the first conductivity channel type provided in a circuit portion other than the signal input portion.

Further another object of the invention is to provide a semiconductor device in which a signal input portion is constructed by an amplifying circuit including an insulating gate type transistor of a first conductivity channel type and an insulating gate type transistor of a second conductivity channel type different from the first conductivity channel type, wherein the insulating gate type transistor of the first conductivity channel type is formed in a semiconductor region that is electrically isolated from the other insulating gate type transistor of the first conductivity channel type provided in a circuit portion other than the signal input portion.

DETAILED DESCRIPTION OF THE PREFERRED EMBODIMENTS

According to the invention, when schematically speaking, a semiconductor region of a signal input portion in which an insulating gate type transistor is formed is independently provided so as to be electrically isolated from an insulating gate type transistor of a same conductivity channel type provided in a circuit portion other than the signal input portion. With such a construction, a potential of the semiconductor region is independently controlled and $V_{th}$ (threshold voltage) of the insulating gate type transistor of the signal input portion can be controlled, thereby enabling a threshold level of an input of a signal amplifying circuit to coincide with a DC level of an input micro signal.

An embodiment of the invention will now be described in detail hereinbelow with reference to the drawings.

Figure 1:
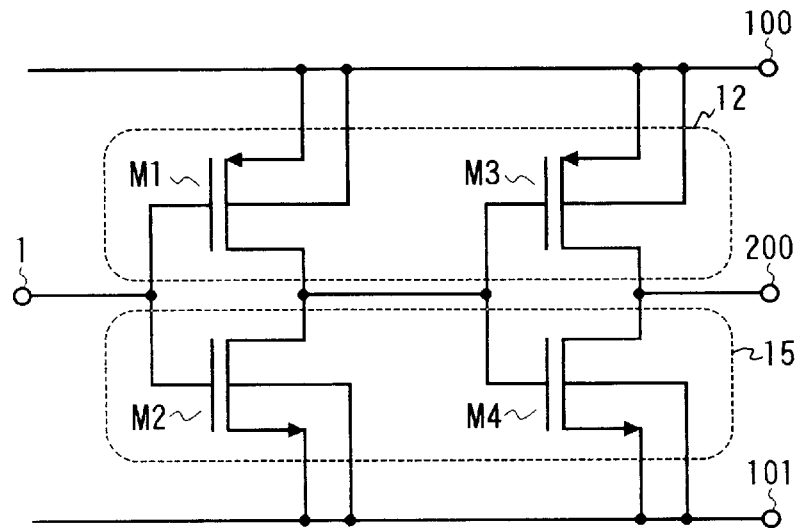
FIG. 1 is a schematic circuit diagram for explaining an example of a CMOS inverter circuit.
Figure 2:
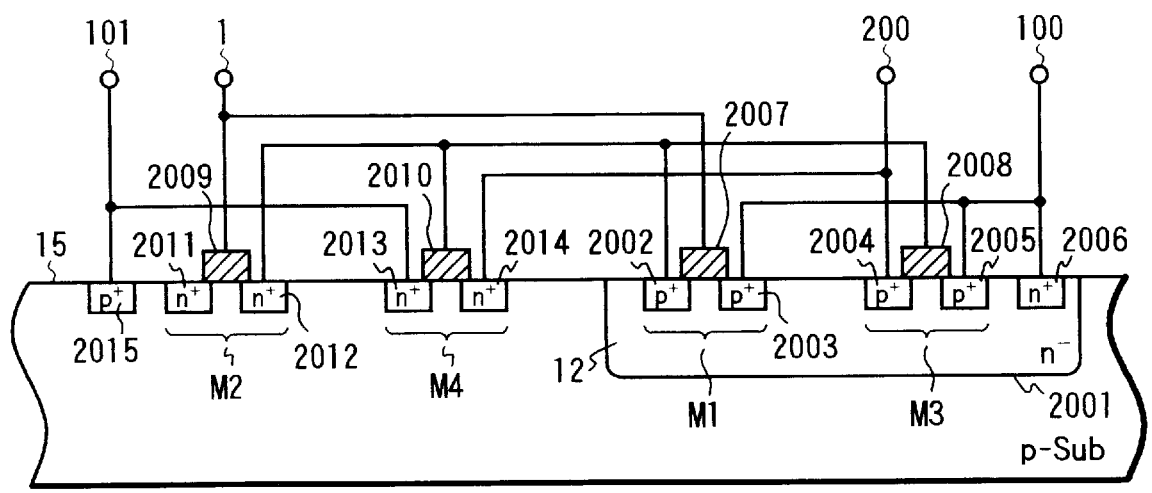
FIG. 2 is a schematic vertical sectional view showing a constructional example of the inverter circuit of FIG. 1.
Figure 3:
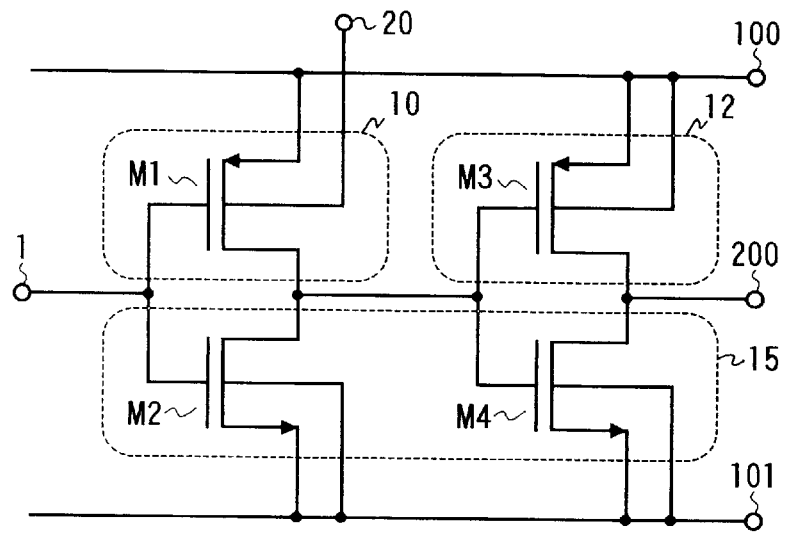
FIGS. 3, 5, and 7 are schematic circuit diagrams each for explaining an example of the CMOS inverter circuit of the invention.
Figure 4:
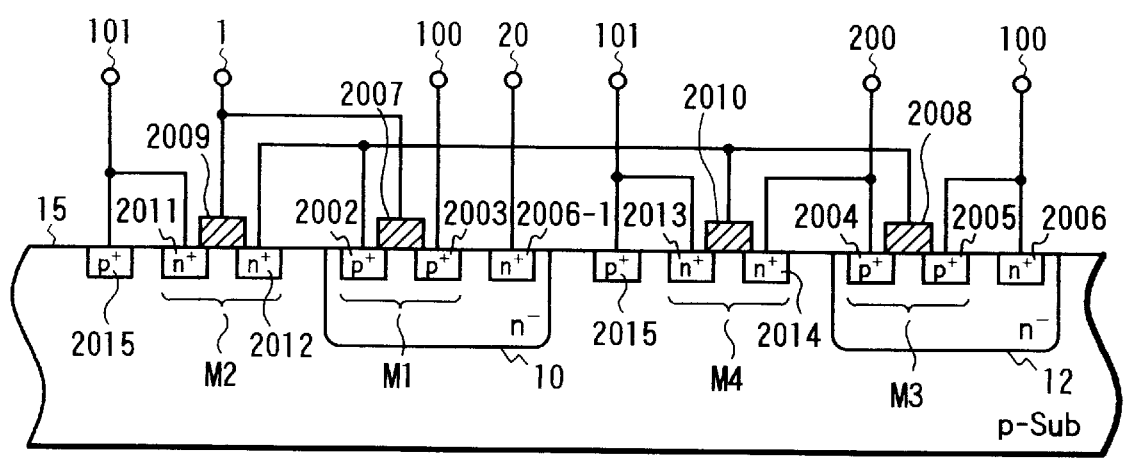
FIGS. 4, 6, and 8 are schematic vertical sectional views for explaining constructional examples of the CMOS inverter circuit shown in FIGS. 3, 5, and 7, respectively.

FIGS. 3 and 4 are a schematic circuit diagram and a schematic vertical sectional view each showing the first embodiment of the invention and show a case where the invention is applied to the circuit construction shown in FIG. 1. The same component elements as those in FIG. 1 are designated by the same reference numerals.

In FIGS. 3 and 4, reference numeral 100 denotes the power source terminal; 101 the ground terminal; 1 the signal input terminal; 200 an output terminal: M1 and M3 the PMOS transistors; and M2 and M4 the NMOS transistors. An input CMOS inverter circuit is constructed by the PMOS Tr M1 and NMOS Tr M2 and an internal CMOS inverter circuit is constructed by the PMOS Tr M3 and NMOS Tr M4, respectively. The PMOS Tr M1 is formed in an N well 10, the PMOS Tr M3 is formed in an N well 12, and the NMOS Trs M2 and M4 are formed on the P-type substrate 15. The N well 10 is connected to a well potential control terminal 20 through a back gate 2006-1 as an n⁺ region. The N well 12 is connected to the power source terminal 100 through the back gate 2006. The P-type substrate 15 is connected to the ground terminal 101 through the back gate 2015 as a p⁺ region.

In the above construction, in the case where a signal of a micro amplitude is supplied to the input terminal 1, each time the signal crosses a threshold voltage of the input CMOS inverter, the signal is transmitted to an internal circuit (internal inverter circuit) at the next stage.

In the case where a value of the input voltage to the input CMOS inverter is close to a threshold value, both of the PMOS Tr and the NMOS Tr operate in a saturation region. Those drain currents are obtained by the following equations, respectively.

$$I_{Dp} = K_p(V_{DD} - V_{in} + V_{Tp})^2 \quad (1)$$

$$I_{Dn} = K_n(V_{in} - V_{Tn})^2 \quad (2)$$

where, $V_{DD}$ denotes a power source voltage; $V_{in}$ a threshold voltage of the CMOS inverter; $I_{Dp}$ a drain current of the PMOS Tr; $I_{Dn}$ a drain current of the NMOS Tr; K a constant; and $V_T$ a threshold voltage of the MOS Tr. They are given by the following equations, respectively.

$$K_p = \frac{\mu_p C_{ox}}{2} \frac{W_p}{L_p} \quad (3)$$

$$K_n = \frac{\mu_n C_{ox}}{2} \frac{W_n}{L_n} \quad (4)$$

where, $\mu$ denotes a mobility of a carrier; $C_{ox}$ an oxide film capacitance; $(W_p/L_p)$ or $(W_n/L_n)$ a size of the PMOS Tr or the NMOS Tr; $W_p$ and $W_n$ widths of the transistors; and $L_p$ and $L_n$ lengths of the transistors.

$$V_{Tp} = T_{TOp} + \gamma\left(\sqrt{2\phi_f + V_{SBp}} - \sqrt{2\phi_f}\right) \quad (5)$$

$$V_{Tn} = T_{TOn} + \gamma\left(\sqrt{2\phi_f + V_{SBn}} - \sqrt{2\phi_f}\right) \quad (6)$$

where, $T_{TO}$: a threshold value when $V_{SB}=0$ ($V_{TOp}$ and $V_{TOn}$ denote threshold values of the PMOS Tr and NMOS Tr, respectively)

$\Phi_f$: a fermi level potential $V_{SB}$: a potential between the source and the substrate ($V_{SBn}$ denotes a source-substrate potential of the NMOS Tr and $V_{SBp}$ denotes a source-substrate potential of the PMOS Tr)

$\gamma$: a parameter

A threshold voltage of the CMOS inverter is obtained as follows by assuming that $I_{Dp}=I_{Dn}$ in the equations (1) and (2).

$$V_{in} = \frac{V_{DD} + V_{Tp} + \sqrt{\frac{K_n}{K_p}} V_{Tn}}{1 + \sqrt{\frac{K_n}{K_p}}} \quad (7)$$

The well potential control terminal 20 in the first embodiment is means for controlling $V_{SBp}$ in the equation (5) and controls the threshold voltage of the CMOS inverter so as to coincide with a DC level of a micro input signal, so that the accurate operation can be realized. It is considered that the threshold voltage of the CMOS inverter which is expressed by the equation (7) changes due to variations in size of MOS Tr, process parameter, and the like. The well potential control terminal 20, however, can correct such variations.

Figure 5:
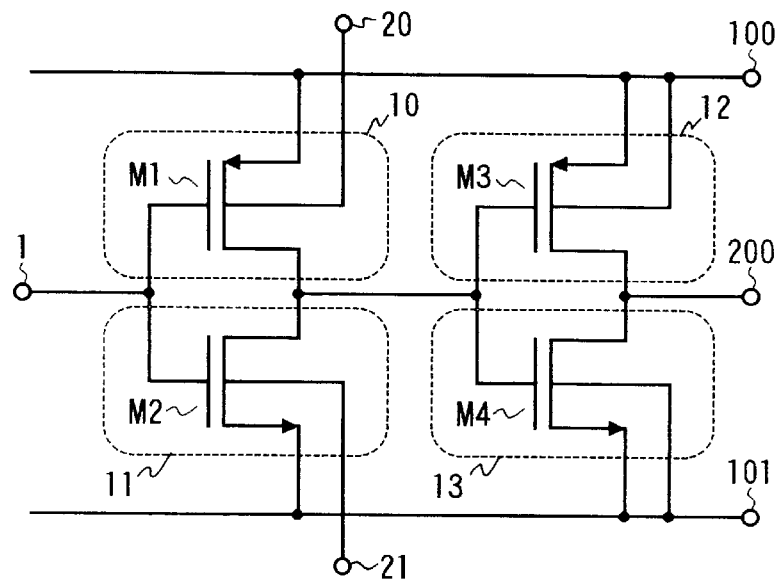
Figure 6:
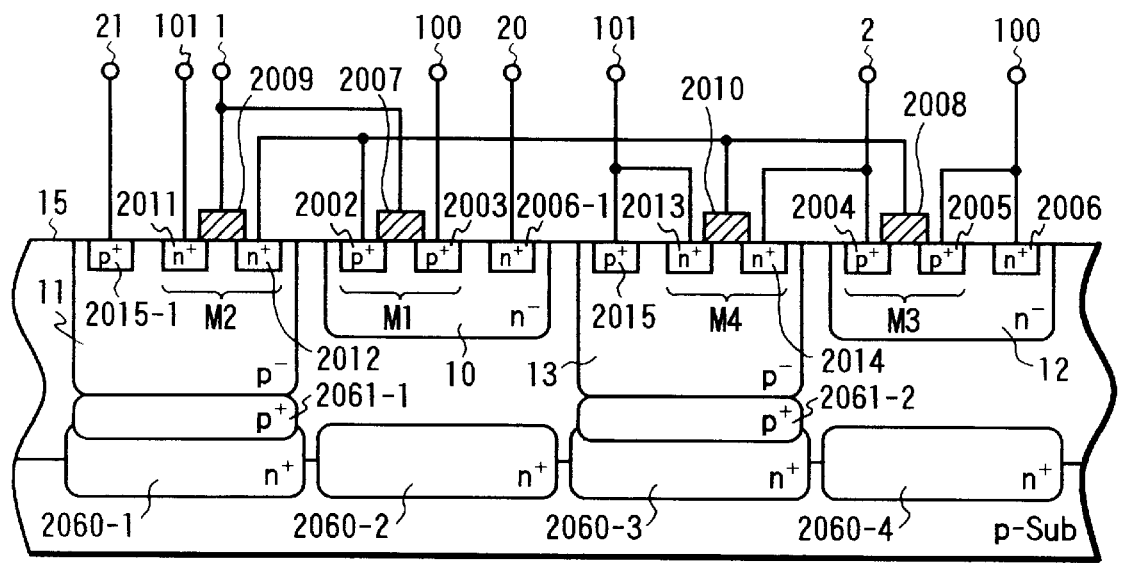

FIGS. 5 and 6 show a case where the second embodiment of the invention is applied to the circuit construction shown in FIG. 1. In FIGS. 5 and 6, the same component elements as those in FIG. 1 are designated by the same reference numerals (the same shall also similarly apply to embodiments which will be described hereinlater).

In the second embodiment, a P well 11 in which the NMOS Tr M2 constructing the input CMOS inverter is formed and a P well 13 in which the NMOS Tr M4 in the internal circuit is formed are formed by using n⁺ buried layers 2060-1 to 2060-4 so as to be electrically isolated. The P well 11 is connected to a well potential control terminal 21 through a p⁺ region 2015-1. The P well 13 is connected to the ground terminal 101 through the p⁺ region 2015. Therefore, as compared with the first embodiment in which only the well potential of the PMOS Tr M1 constructing the input CMOS inverter is controlled, the second embodiment is constructed in a manner such that the well potential of the NMOS Tr M2 can be also simultaneously controlled. With such a construction, the threshold voltage of the input CMOS inverter can be controlled in a wider range. In FIG. 6, reference numerals 2061-1 and 2061-2 denote p⁺ regions, respectively.

Figure 7:
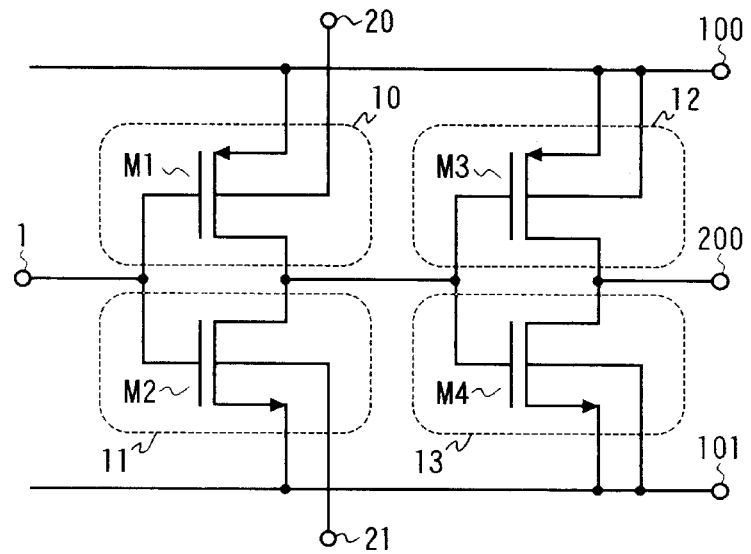
Figure 8:
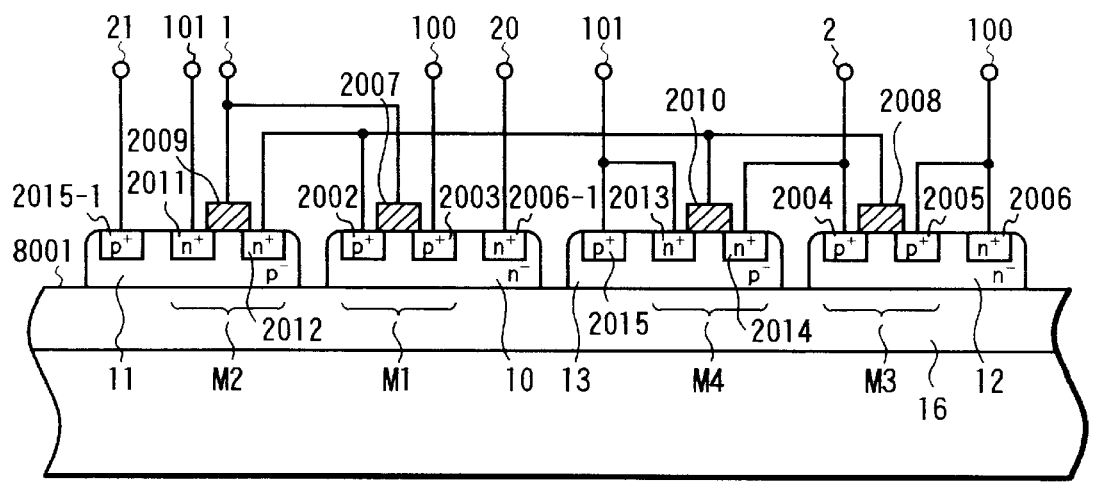

FIGS. 7 and 8 show a case where the third embodiment of the invention is applied to the circuit construction shown in FIG. 1. In the third embodiment, the N wells 10 and 12 and the P wells 11 and 13 which are respectively electrically isolated are formed on an SOI substrate having an isolating layer 16 formed on a substrate 8001 such as a semiconductor substrate or the like, the PMOS Tr M1 constructing the input CMOS inverter is formed on the N well 10, the PMOS Tr M3 constructing the internal circuit is formed on the N well 12, the NMOS Tr M2 constructing the input CMOS inverter is formed on the P well 11, and the NMOS Tr M4 constructing the internal circuit is formed on the P well 13. The N wells 10 and 12 are connected to the well potential control terminal 20 and power source terminal 100, respectively. The P wells 11 and 13 are connected to the well potential control terminal 21 and ground terminal 101, respectively. With such a construction, the threshold voltage of the input CMOS inverter can be independently controlled in a wide range in a manner similar to the second embodiment.

Figure 9:
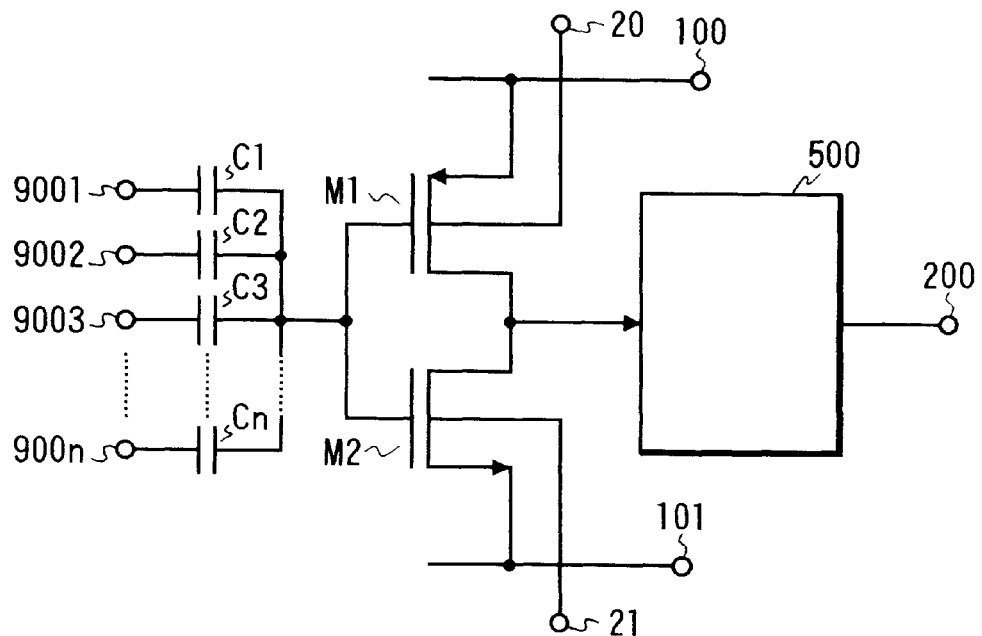
FIG. 9 is a schematic circuit diagram for explaining a constructional example of a circuit in the case where the invention is applied to a v-MOS circuit.

FIG. 9 shows a circuit according to the forth embodiment of the invention. The embodiment shows a case where the invention is applied to a v-MOS circuit. In FIG. 9, reference numerals 9001, 9002, 9003, . . . , 900n denote signal input terminals and $C_1$, $C_2$, $C_3$, . . . , $C_n$ indicate capacitors. Terminals on the side opposite to the signal input terminals of the capacitances are commonly connected to an input of the CMOS inverter constructed by the PMOS Tr M1 and NMOS Tr M2, respectively.

When signals are supplied to the signal input terminals 9001 to 900n, charges corresponding to the signal inputs are accumulated in the capacitors $C_1$ to $C_n$ by the signal inputs, respectively. A signal is supplied to the CMOS inverter in correspondence to the sum of the accumulated charge amount.

Reference numeral 500 denotes an internal circuit connected to an output of the CMOS inverter; 200 the output terminal; and 20 and 21 the potential control terminals of the wells in which the PMOS Tr M1 and NMOS Tr M2 are formed, respectively.

In the above construction, an input voltage amplitude of the CMOS inverter constructed by the PMOS Tr M1 and NMOS Tr M2 becomes as follows by assuming that voltages which are supplied to input terminals 1, 2, 3, . . . , n are set to $V_1$, $V_2$, $V_3$, . . . $V_n$.

$$\frac{V_1 C_1 + V_2 C_2 + V_3 C_3 + \ldots + V_n C_n}{C_1 + C_2 + C_3 + \ldots + C_n}$$

For example, when $C_1 = C_2 = C_3 = \ldots = C_n = C$, $$\frac{1}{n}(V_1 + V_2 + V_3 + \ldots + V_n)$$

when $$C_1 = \frac{1}{2}C_2 = \frac{1}{4}C_3 = \ldots = \frac{1}{2^{n-1}}C_n,$$

$$\frac{1}{2^n - 1}(V_1 + 2V_2 + 4V_3 + \ldots + 2^{n-1}V_n)$$

In the case where $V_1 = V$ and $V_2 = V_3 = \ldots = V_n = 0$, the input amplitudes of the inverters extremely decrease as follows.

$$\frac{1}{n}V, \frac{1}{2^n - 1}V$$

According to the invention, even in the above case, by properly controlling the voltages at the well potential control terminals 20 and 21, the threshold voltage of the CMOS inverter is made coincide with the input DC level, thereby enabling the operation to be accurately performed.

Figure 10:
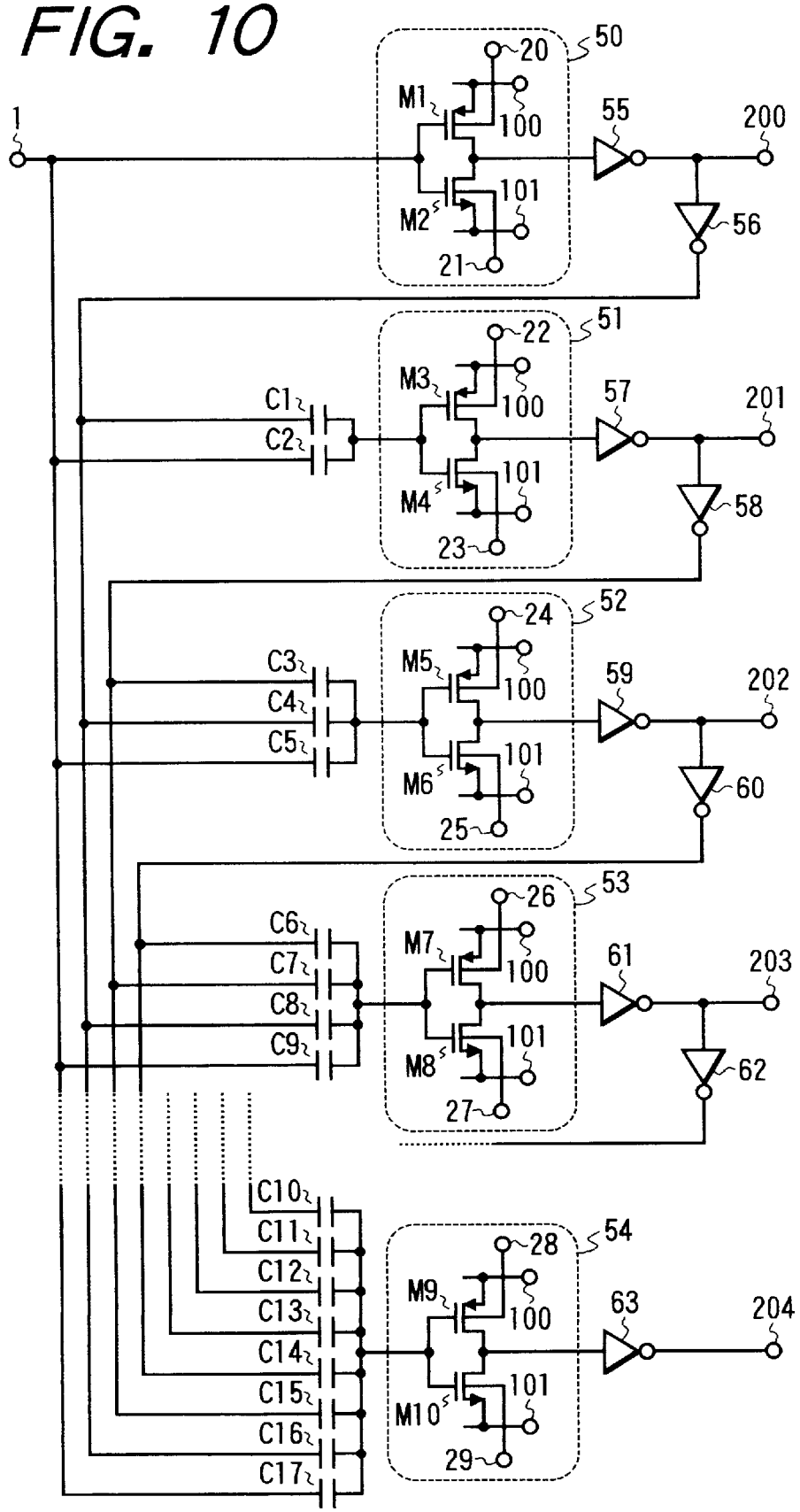
FIG. 10 is a schematic circuit diagram for explaining an example of an 8-bit A/D converter using the invention.

FIG. 10 is a circuit diagram showing the fifth embodiment of the invention and shows an example of an 8-bit A/D (analog-digital) converter of a multi-step type constructed by using the foregoing v-MOS.

In FIG. 10, reference numerals 50 to 54 denote CMOS inverters of the invention; 55 to 63 CMOS inverters; $C_1$ to $C_{17}$ the capacitors; 200 to 204 digital output terminals; and 1 the analog input terminal. The analog input terminal 1 is connected to an input of the inverter 50 and is also connected to inputs of the inverters 51, 52, 53, and 54 through the capacitors $C_2$, $C_5$, $C_9$, and $C_{17}$. An output of the inverter 50 is connected to the digital output terminal (MSB) 200 through the inverter 55 and is also connected to inputs of the inverters 51, 52, 53, and 54 through the capacitors $C_1$, $C_4$, $C_8$, and $C_{16}$. An output of the inverter 51 is connected to the digital output terminal 201 through the inverter 57 and is also connected to the inverter 52, 53, and 54 through the capacitors $C_3$, $C_7$, and $C_{15}$. Hereinafter, outputs of upper bits are sequentially connected to inputs of all of lower inverters through the inverters and capacitors. Thus, an analog signal inputted from the digital output terminal 200 is converted to a digital signal and is outputted.

Figure 11:
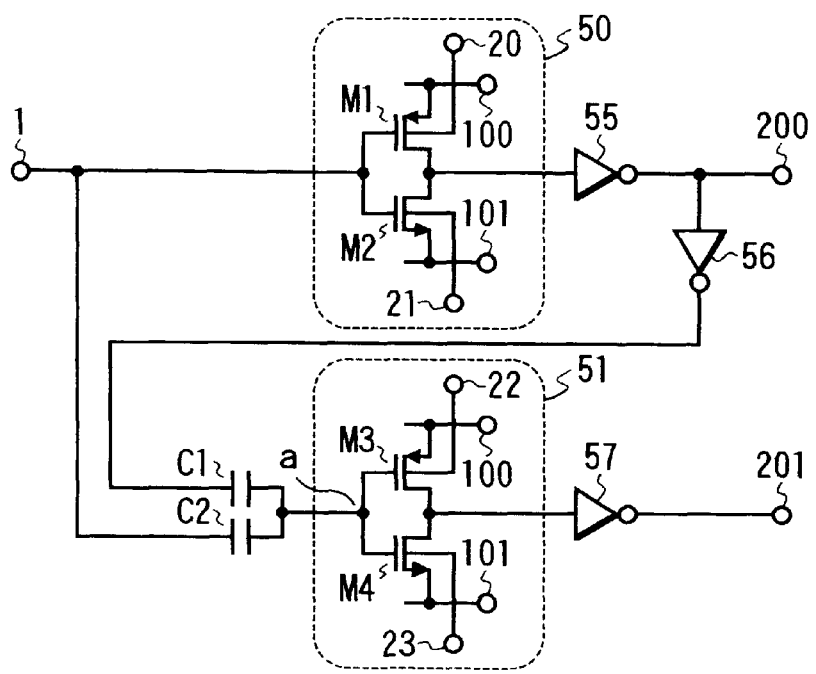
FIG. 11 is a schematic circuit diagram for explaining an example the operation of upper two bits of the circuit in FIG. 10.

The operation in the above-mentioned construction will now be described with respect to upper two bits shown in FIG. 11 for simplification. When the voltage $V_1$ which is sufficiently lower than the threshold value of the inverter 50 is supplied to the input terminal 1, the digital output terminal 200 is specified to the low level through the inverters 50 and 55. The resultant signal is inverted by the inverter 56. A voltage of one end of the capacitor $C_1$ is equal to the power source voltage. Therefore, a voltage at an input point (a) of the inverter 51 is set to a value obtained by dividing a difference between the power source voltage and the voltage $V_1$ by a capacitance ratio of the capacitors $C_1$ and $C_2$ as follows by setting $V_1$ to a reference.

$$V_a = V_1 + \frac{C_1}{C_1 + C_2}(V_{DD} - V_1)$$

At this time, since the voltage $V_1$ is sufficiently low, a voltage $V_a$ is smaller than the threshold value of the inverter 51, so that the output terminal 201 is specified to the low level. As $V_1$ increases, $V_a$ also increases. However, since $V_1 < V_a$, $V_a$ first exceeds the threshold value of the inverter 51. Therefore, an output 201 is first inverted and is set to the high level. Further, when $V_1$ increases and exceeds the threshold value of the inverter 50, the output 200 is inverted and is set to the high level. Thus, a voltage at one end of $C_1$ is equal to a ground potential. At this time, a potential at the (a) point is set to the following value $V_a$ obtained by dividing $V_1$ by the capacitance ratio of $C_1$ and $C_2$.

$$V_a = \frac{C_2}{C_1 + C_2} V_1$$

Figure 12:
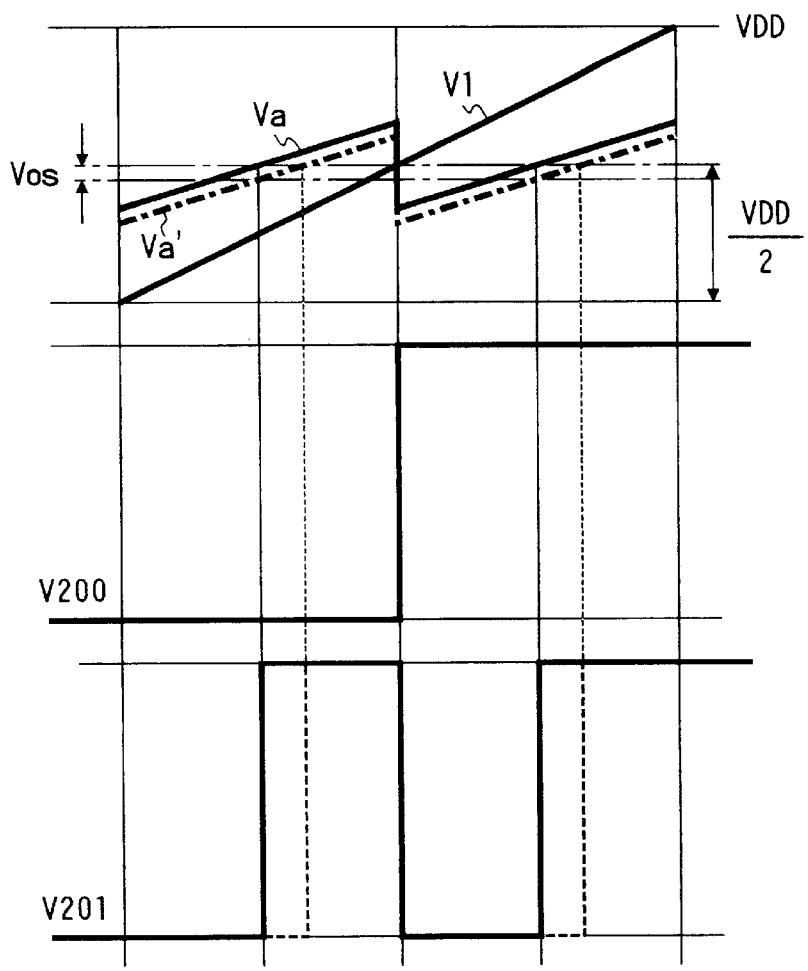
FIG. 12 is a timing chart for explaining an example of the operation of two bits shown in the schematic circuit diagram of FIG. 11.

Since the value $V_a$ is smaller than the threshold value of the inverter 51, the signal of the inverter 51 is inverted, so that the output 201 is set to the low level. When $V_1$ further increases, $V_a$ increases in proportion to the value $V_1$. When $V_a$ exceeds the threshold value of the inverter 51, the output 201 is inverted and is set to the high level (refer to FIG. 12).

As will be obviously understood from the fourth embodiment, as for the input voltages of the inverters 50 to 54 in the above construction, as the bit is lower, the capacitance dividing ratio decreases and the amplitude decreases. Since a parasitic gate capacitance exists in each of the MOS Trs M1 to M10 constructing the inverters 50 to 54, the voltage which is supplied to each of the inverters is deviated to the DC level by an offset voltage $V_{os}$ as shown by $V_a'$ in FIG. 12. In this case, a deviation occurs in the timing of the digital output as shown by a broken line V201 in FIG. 12, so that an erroneous operation is causes. Since the CMOS inverters in which the threshold values can be controlled according to the invention are used as inverters 50 to 54, the threshold value of each inverter is controlled so as to coincide with the DC level at each stage, thereby enabling the erroneous operation to be prevented.

Figure 13:
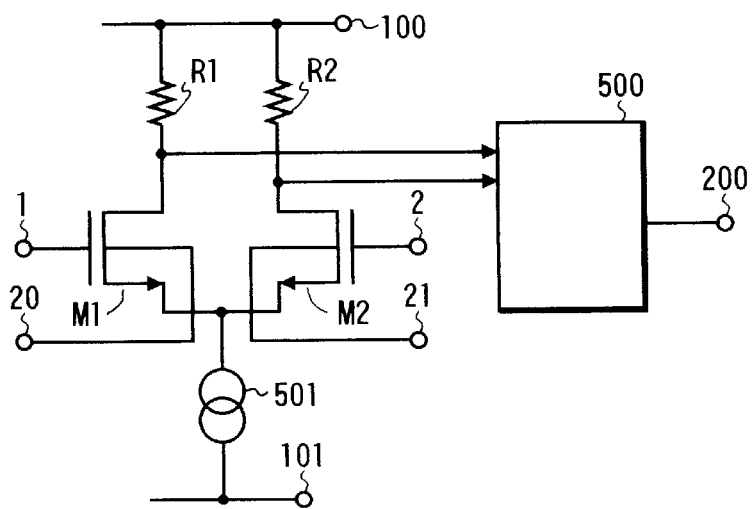
FIG. 13 is a schematic circuit diagram in the case where the invention is applied to a differential amplifying circuit.

FIG. 13 is a circuit diagram showing the sixth embodiment of the invention and shows a case where the invention is applied to a differential amplifying circuit. Reference symbols M11 and M12 denote NMOS Trs. A gate of the NMOS Tr M11 is connected to the signal input terminal 1, a drain is connected to the power source 100 through a resistor R1, and a source is connected to the ground terminal 101 together with a source of the NMOS Tr M12 through a current source 501. A gate of the NMOS Tr M12 is connected to a signal input terminal 2 and a drain is connected to the power source 100 through a resistor R2. The drains of the NMOS Trs M11 and M12 are connected to an internal circuit 500, respectively. The NMOS Trs M11 and M12 are formed in wells which are electrically isolated from the NMOS Trs included in the internal circuit. The wells are connected to the well potential control terminal 20 and 21, respectively.

In the differential amplifying circuit with the foregoing construction, characteristics of the input MOS Trs M11 and M12 are designed so as to be equalized. In the case where the characteristics are deviated by variations at the time of manufacturing, however, the threshold values are adjusted by the control terminals 20 and 21, thereby enabling the erroneous operation to be prevented.

An example in which the CMOS inverter is used as signal amplifying means has been shown in the first to fifth embodiments and an example in which the differential amplifying circuit is used has been shown in the sixth embodiment. However, the invention can be also applied to the other format so long as the amplifying circuit is means for amplifying a signal.

As a power source which is connected to the well potential control terminal of the invention, an arbitrary construction can be used so long as the well can be controlled to a desired potential. In order to give a desired potential, however, it is preferable that an amplitude of the voltage is not large. Therefore, generally, a constant voltage source is preferably used. Even when the constant voltage source is used, it will be obviously understood that the setting itself of the voltage value can be varied to give a necessary potential.

In addition, the present invention is not limited to the foregoing embodiments but many modifications and variations are possible within the spirit and scope of the appended claims of the invention.

As described above, according to the invention, a semiconductor integrated circuit device in which by controlling the threshold value of the insulating gate type transistor constructing the amplifier of the signal input means, it can be made coincide with the DC level of the input signal can be obtained.

Thus, the erroneous operation of the circuit can be prevented and the accurate operation can be performed even for a smaller micro signal.

What is claimed is:

1. A semiconductor apparatus comprising:
    a first group of two insulated gate type transistors with different first and second conductivity types of channels having source, drain and gate electrodes, wherein the drain electrodes of the transistors are connected together, the source electrodes of the transistors are connected to a power source, and a region in which the transistor of the first conductivity type is provided is connected to a potential control terminal; and
    a second group of two insulated gate type transistors having different first and second conductivity having source, drain and gate electrodes types of channels, wherein the drain electrodes of the transistors are connected together, and the source electrodes of the transistors are connected to a power source,
    wherein the gate electrodes of the transistors of the first group are connected to an input node, the drain electrodes of the transistors of the first group are connected to the gate electrodes of the transistors of the second group, and the drain electrodes of the transistors of the second group are connected to an output node, and
    the insulated gate type transistor of the first conductivity type of the first group is formed in a semiconductor region electrically separated from the insulated gate type transistor of the first conductivity type of the second group.

2. An apparatus according to claim 1, wherein
    the insulated gate type transistor of the second conductivity type of the first group is electrically isolated from the insulated gate type transistor of the second conductivity type of the second group.

3. An apparatus according to claim 1, wherein the insulated gate type transistors are formed by using a semiconductor layer provided on an insulating region, and the potential control terminal is connected electrically to a first semiconductor layer in which the insulated gate type transistors of the first conductivity type are formed.

4. An apparatus according to claim 3, wherein the first semiconductor layer is formed in a semiconductor layer arranged separately from the semiconductor layer in which another insulated gate type transistor is formed.

5. An apparatus according to claim 2, further comprising a second potential control terminal for controlling a potential of a region in which the insulated gate type transistor of the second conductivity type of the first group is formed.

6. An apparatus according to claim 1, wherein
    the insulated gate type transistors are formed in a semiconductor substrate,
    the potential control terminal for controlling the potential is connected electrically to a region in which the insulated gate type transistor of the first conductivity type is formed, and
    a region in which the other insulated gate type transistors are formed is connected to the power source to which the source electrodes of respective insulated gate type transistors are connected.

7. An apparatus according to claim 1, wherein the input node is connected to a first terminal of each of a plurality of capacitor elements having first and second terminals, and the second terminals of each of the plurality of capacitor elements are used as signal input terminals.

8. An apparatus according to claim 1, wherein a plurality of amplifying circuits are provided to form a first circuit unit, with input portions of respective amplifying circuits connected commonly to a first terminal of each of a plurality of capacitor elements, and the second terminal of each of the plurality of capacitor elements are connected to the input node.

9. An apparatus according to claim 8, wherein an output from the first circuit unit is connected to a signal input node of a second circuit unit.

10. An apparatus according to claim 9, wherein the number of capacitor elements in the first circuit unit is different from a number of capacitor elements in the second circuit unit.

11. An apparatus according to claim 9, wherein a number of the capacitor elements in the second circuit unit is larger by one than the number of the capacitor elements in the first circuit unit.

12. An apparatus according to claim 1, wherein a plurality of amplifying circuits are provided, and an output from a first amplifying circuit is connected through a capacitor element to an input portion of a second amplifying circuit.

13. An apparatus according to claim 12, wherein the second amplifying circuit has plural capacitor elements including a capacitor element having one electrode to which the first amplifying circuit supplies an output, and a capacitor element having one electrode to which a signal inputted into the input portion of the first amplifying circuit is inputted, and the other electrode of respective capacitor elements are connected commonly to the input portion of the second amplifying circuit.

* * * * *

UNITED STATES PATENT AND TRADEMARK OFFICE
CERTIFICATE OF CORRECTION

PATENT NO.    : 6,097,067
DATED         : August 1, 2000
INVENTOR(S)   : AKIHIRO OUCHI ET AL.

It is certified that error appears in the above-identified patent and that said Letters Patent is hereby corrected as shown below:

ON THE TITLE PAGE:

[57] ABSTRACT

Line 1,  "In a" should read --A--; and
      Line 11, "made" should read --made to--.

COLUMN 5:

Line 35, "$V_1, V_2, V_3, ...V_n.$" should read --$V_1, V_2, V_3 ..., V_n.$--; and
      Line 64, "made" should read --made to--.

COLUMN 7:

Line 4,  "causes." should read --caused.--;
      Line 57, "made" should read --made to--; and
      Line 61, "micro signal." should read --microsignal.--.

UNITED STATES PATENT AND TRADEMARK OFFICE
CERTIFICATE OF CORRECTION

PATENT NO.    : 6,097,067
DATED         : August 1, 2000
INVENTOR(S)   : AKIHIRO OUCHI ET AL.

It is certified that error appears in the above-identified patent and that said Letters Patent is hereby corrected as shown below:

COLUMN 8:

Line 7, "electrodes" should read --electrode--.

Signed and Sealed this

Twenty-second Day of May, 2001

Attest:

NICHOLAS P. GODICI

Attesting Officer    Acting Director of the United States Patent and Trademark Office